United States Patent
Arita et al.

(10) Patent No.: US 6,849,521 B2
(45) Date of Patent: Feb. 1, 2005

(54) METHOD FOR MANUFACTURING A SEMICONDUCTOR DEVICE

(75) Inventors: Koji Arita, Osaka (JP); Yasuhiro Uemoto, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 27 days.

(21) Appl. No.: 09/938,528

(22) Filed: Aug. 27, 2001

(65) Prior Publication Data

US 2002/0025654 A1 Feb. 28, 2002

(30) Foreign Application Priority Data

Aug. 31, 2000 (JP) ........................................ 2000-263466

(51) Int. Cl.[7] .............................................. H01L 21/76
(52) U.S. Cl. ........................................ 438/430; 438/435
(58) Field of Search ................................ 438/404, 424, 438/430, 435

(56) References Cited

U.S. PATENT DOCUMENTS

| | | | |
|---|---|---|---|
| 4,631,803 A | * 12/1986 | Hunter et al. | ........... 29/576 |
| 4,983,226 A | * 1/1991 | Hunter et al. | ........... 29/30 |
| 5,250,836 A | * 10/1993 | Miura et al. | ........... 257/506 |
| 5,416,041 A | * 5/1995 | Schwalke | ........... 438/404 |
| 5,504,033 A | 4/1996 | Bajor et al. | |
| 5,561,073 A | * 10/1996 | Jerome et al. | ........... 438/404 |
| 5,581,110 A | 12/1996 | Razouk et al. | |
| 5,811,315 A | 9/1998 | Yindeepol et al. | |
| 5,872,044 A | 2/1999 | Hemmenway et al. | |
| 5,872,045 A | * 2/1999 | Lou et al. | ........... 438/432 |

FOREIGN PATENT DOCUMENTS

| | | |
|---|---|---|
| EP | 1 026 734 | 8/2000 |
| JP | 04-134844 | 5/1992 |
| JP | 2589209 | 12/1996 |

OTHER PUBLICATIONS

European Search Report Dec. 6, 2001, Application No. 01120911.1–1524.

* cited by examiner

*Primary Examiner*—Erik J. Kielin
*Assistant Examiner*—David S. Blum
(74) *Attorney, Agent, or Firm*—Nixon Peabody LLP; Donald R. Studebaker (57) ABSTRACT

In a semiconductor layer formed on a first insulating film is formed an element isolation groove extending to the first insulating film. Thereafter, a second insulating film is deposited in the element isolation groove by using a vapor deposition method.

3 Claims, 8 Drawing Sheets

METHOD FOR MANUFACTURING A SEMICONDUCTOR DEVICE

BACKGROUND OF THE INVENTION

The present invention relates to a method for manufacturing a semiconductor device in which trench isolation is provided in an SOI (Silicon On Insulator or Semiconductor On Insulator) substrate for element isolation.

A semiconductor device that has an SOI substrate formed from an insulating film and a semiconductor layer thereon and has an element such as transistor or resistance formed at the SOI substrate is known to be advantageous in that it is capable of implementing an increased operation speed or increased voltage resistance due to reduced parasitic capacitance, and capable of implementing increased reliability due to prevention of latch-up, and the like.

Figure 14:
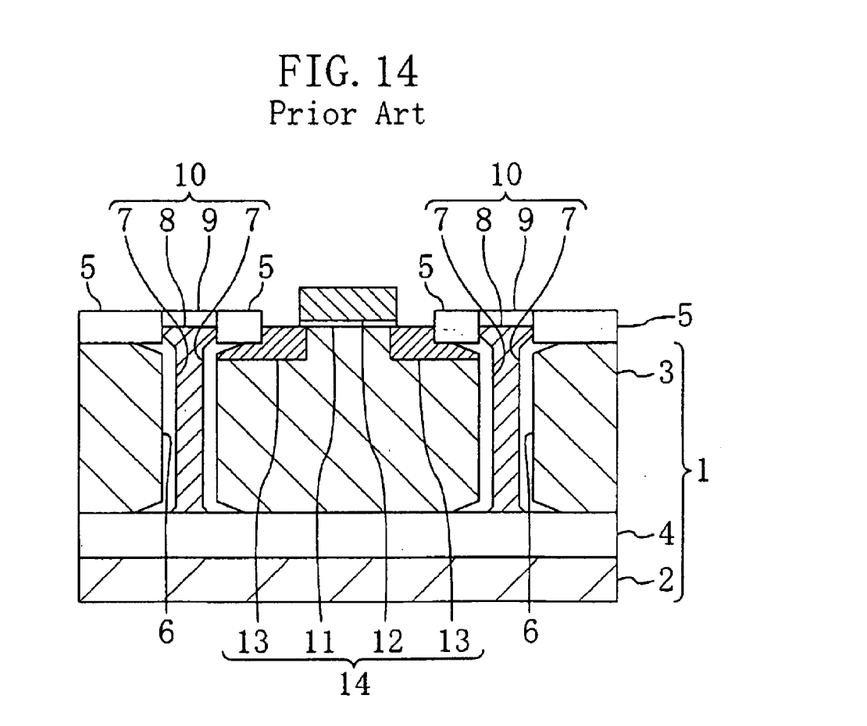
FIG. 14 is a cross-sectional view of a conventional semiconductor device.

FIG. 14 shows a cross-sectional structure of a conventional semiconductor device, specifically, a semiconductor device having a MOS (Metal Oxide Semiconductor) transistor formed on the SOI substrate.

As shown in FIG. 14, a semiconductor substrate 1 is an SOI substrate in which a substrate base portion 2 and a substrate surface portion 3 are electrically isolated from each other by a first insulating film 4. The substrate base portion 2 and the substrate surface portion 3 are both formed from single crystal semiconductor silicon. The substrate surface portion 3 is covered with a silicon oxide film 5 in the region other than an element formation region. An element isolation groove (hereinafter, referred to as "trench") 6 is formed through the silicon oxide film 5 and the substrate surface portion 3 at the location corresponding to an element isolation region.

A second insulating film 7 of silicon oxide is formed at the wall surface of the trench 6. The trench 6 having the second insulating film 7 formed at its wall surface is filled with an embedded layer 8 of polycrystalline silicon. The surface of the embedded layer 8 is covered with a third insulating film 9 of silicon oxide. A trench element isolation structure 10 is thus formed from the second insulting film 7, the embedded layer 8 and the third insulating film 9.

A gate electrode 12 is formed on the region of the substrate surface portion 3 surrounded by the trench element isolation structure 10, i.e., on the element formation region, with a gate insulating film 11 interposed therebetween. A pair of impurity diffusion layers 13 serving as source and drain regions are formed on both sides of the gate electrode 12 in the substrate surface portion 3. A MOS transistor 14 is formed from the gate electrode 12, the impurity diffusion layers 13 and the like. Note that, in the conventional semiconductor device, another element such as bipolar element or resistive element may be formed in the element formation region, instead of or in addition to the MOS transistor 14.

Figure 15A:
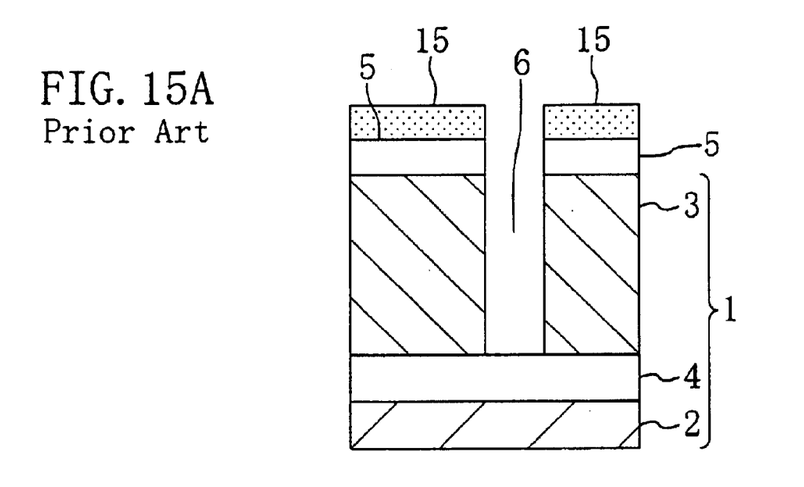
FIGS. 15A and 15B are cross-sectional views illustrating the steps of a conventional method for manufacturing a semiconductor device.
Figure 15B:
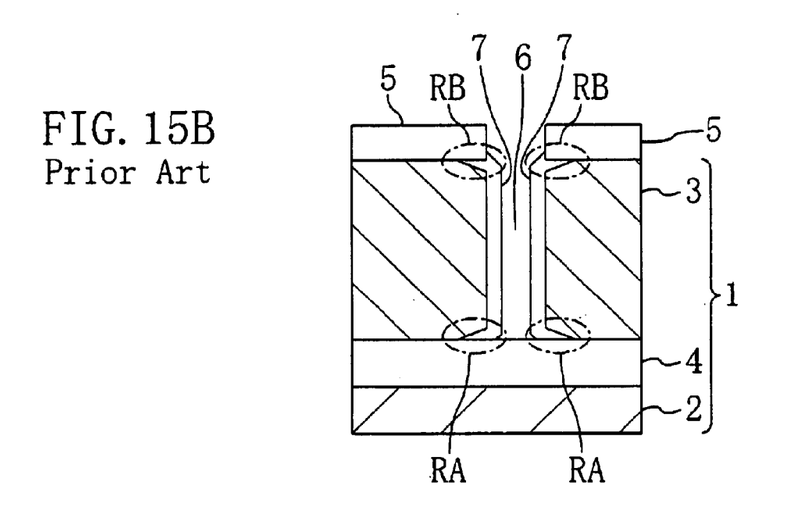

FIGS. 15A and 15B are cross-sectional views illustrating the steps of forming the trench element isolation structure in the conventional semiconductor device of FIG. 14.

First, as shown in FIG. 15A, the silicon oxide film 5 and the substrate surface portion 3 are etched using a mask pattern 15, thereby forming the trench 6 extending to the first insulating film 4. For example, this etching is conducted by a reactive ion etching method using a gas such as hydrogen bromide. The mask pattern 15 is formed from a resist film patterned by a normal photolithography technique or from a silicon nitride film or a silicon oxide film.

As shown in FIG. 15B, the substrate surface portion 3 is then thermally oxidized at the wall surface of the trench 6, thereby forming a second insulating film 7 of silicon oxide. Thereafter, the resist film or the silicon nitride film or silicon oxide film used as the mask pattern 15 for etching is removed.

In the aforementioned conventional method for manufacturing a semiconductor device, however, oxygen atoms are introduced into the interface between the first insulating film 4 and the substrate surface portion 3 as well as the interface between the substrate surface portion 3 and the silicon oxide film 5 during thermal oxidation for forming the second insulating film 7. As a result, a silicon oxide film is grown along each interface (see regions RA and RB in FIG. 15B). Oxidation of the single crystal semiconductor silicon of the substrate surface portion 3 causes volume expansion. Therefore, compressive stresses are generated in the portion of the substrate surface portion 3 surrounded by the trench 6, i.e., in the semiconductor layer of the element formation region, thereby producing crystal defects in the semiconductor layer. This problem becomes more remarkable when attempting dimensional reduction of the element, reduction in thickness of the single crystal silicon film serving as the substrate surface portion 3.

In order to solve the aforementioned problem, Japanese Patent Gazette No. 2589209B discloses a method for relieving the stresses causing generation of crystal defects. More specifically, after a trench is formed, a polycrystalline semiconductor film is deposited in the trench in a reduced-pressure vapor phase so as to round a trench corner. A thermal oxide film is formed thereafter. Thus, the stresses are relieved particularly in the lower corner (which corresponds to the region RA of FIG. 15B).

According to the method of the aforementioned Japanese Patent Gazette No. 2589209B, however, the curvature of each corner depends on the coating profile of the polycrystalline semiconductor film. Therefore, the degree of stress relief in the thermal oxidation step after deposition of the polycrystalline semiconductor film varies depending on the coating profile. This means that the aforementioned crystal defects may possibly be generated. Accordingly, the crystal defects are more likely to be generated depending on the degree of process variation, and this may become a critical cause of the reduced yield of the element.

SUMMARY OF THE INVENTION

In view of the foregoing problems, it is an object of the present invention to completely preventing crystal defects from being generated in a semiconductor layer of an element formation region due to the stresses applied to, e.g., a trench corner upon forming a trench element isolation structure in an SOI substrate.

In order to achieve the aforementioned object, a method for manufacturing a semiconductor device according to the present invention includes the steps of: forming, in a semiconductor layer formed on a first insulating film, an element isolation groove extending to the first insulating film; and depositing a second insulating film in the element isolation groove by using a vapor deposition method.

According to the manufacturing method of the present invention, the element isolation groove extending to the first insulating film is formed in the semiconductor layer on the first insulating film, and the second insulating film is deposited in the element isolation groove by using a vapor deposition method. This enables the trench element isolation structure to be formed in the SOI substrate without forming a thermal oxide film at the wall surface of the element isolation groove. In other words, the thermal oxidation step is no longer required that causes an oxide film to be grown along the interface between the first insulating film and the semiconductor layer. As a result, crystal defects can be completely prevented from being generated in the semiconductor layer of the element isolation region due to the stresses applied to the trench corner or the like.

In the manufacturing method of the present invention, the step of depositing the second insulating film is preferably conducted so as to partially fill the element isolation groove, and the method preferably further includes, after the step of depositing the second insulating film, the step of forming an embedded layer so as to completely fill the element isolation groove.

In this case, forming the embedded layer from the same material as that of the semiconductor layer would eliminate the difference of a physical constant such as thermal expansion coefficient between the embedded layer and the semiconductor layer. Therefore, in various thermal processing steps in the semiconductor manufacturing process as well, stress generation can be suppressed as compared to the case where the element isolation groove is filled only with an insulating film, thereby enabling improvement in reliability of the element.

The manufacturing method of the present invention may further include, after the step of forming the embedded layer, the step of forming a third insulating film on the embedded layer. In this case, degradation in. reliability of the element does not occur even when the embedded layer is electrically conductive.

Preferably, the manufacturing method of the present invention further includes, between the step of forming the element isolation groove and the step of depositing the second insulating film, the step of forming an oxide film by oxidizing the semiconductor layer at a wall surface of the element isolation groove, and the step of depositing the second insulating film preferably includes the step of depositing the second insulating film so as to cover the oxide film.

Thus, the trench element isolation structure can be implemented by the laminated structure of the oxide film formed at the wall surface of the element isolation groove by oxidation (specifically, thermal oxidation) and the second insulating film formed on the oxide film by a vapor deposition method. This enables significant reduction in thickness of the oxide film formed at the wall surface of the element isolation groove. As a result, in the thermal oxidation step of forming the oxide film, the thickness of the oxide film can be set so as to prevent crystal defects from being generated due to the stresses intensively applied to the trench corner or the like.

Preferably, the oxide film has a thickness of 50 nm or less.

This ensures that crystal defects are prevented from being generated in the thermal oxidation step of forming the oxide film.

DETAILED DESCRIPTION OF THE INVENTION

First Embodiment

Hereinafter, a method for manufacturing a semiconductor device according to the first embodiment of the present invention will be described with reference to the figures.

FIGS. 1 to 5 are cross-sectional views illustrating the steps of the method for manufacturing a semiconductor device according to the first embodiment.

Figure 1:
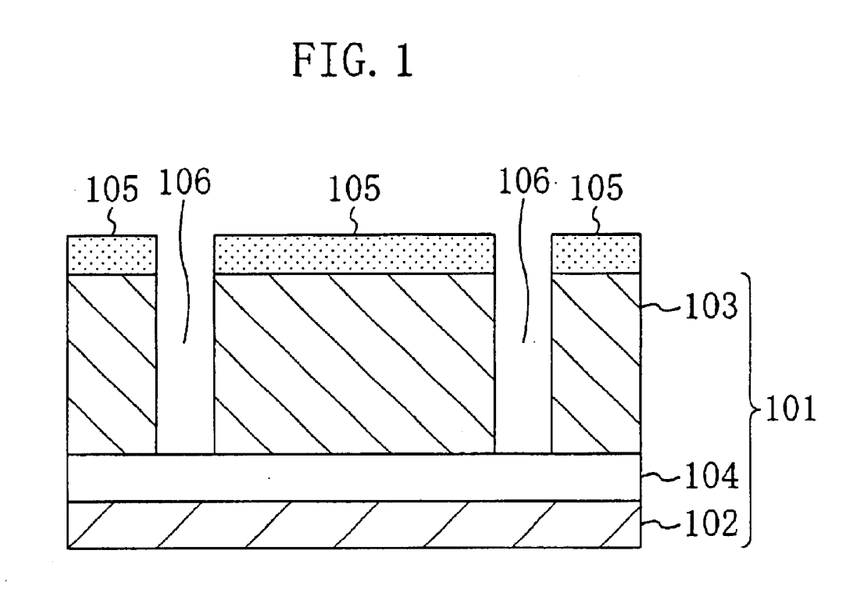
FIG. 1 is a cross-sectional view illustrating a step of a method for manufacturing a semiconductor device according to a first embodiment of the present invention.

First, as shown in FIG. 1, a semiconductor substrate 101 having an SOI structure is prepared. In the semiconductor substrate 101, a substrate base portion 102 and a substrate surface portion 103 are laminated each other with a first insulating film 104 of silicon oxide interposed therebetween. The substrate base portion 102 and the substrate surface portion 103 are both formed from single crystal semiconductor silicon. Thereafter, photoresist is applied to the whole surface of the substrate surface portion 103 of the semiconductor substrate 101 so as to form a resist film. By using a photolithography technique, the resist film thus formed is patterned into a resist pattern 105 having an opening on a prescribed region that will result in an element isolation region in a later step. The substrate surface portion 103 is then dry-etched using the resist pattern 105 as an etching mask, whereby an element isolation groove 106 extending to the first insulating film 104 of the semiconductor substrate 101 is formed through the substrate surface portion 103.

Note that, in the step of dry-etching the substrate surface portion 103, the first insulating film 104 can be used as an etching stopper.

Figure 2:
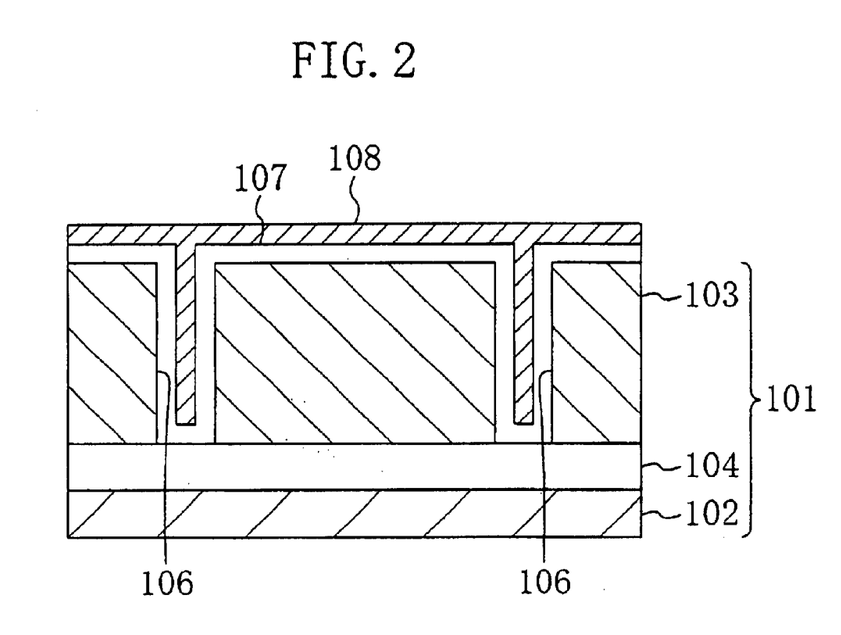
FIG. 2 is a cross sectional view illustrating a step of the method for manufacturing a semiconductor device according to the first embodiment of the present invention.

Thereafter, the resist pattern 105 is removed. As shown in FIG. 2, by using a vapor deposition method, a second insulating film 107 of silicon oxide is then deposited on the whole surface of the substrate surface portion 103 including the inside of the element isolation groove 106 so as to partially fill the element isolation groove 106. Thereafter, an embedded layer 108 of polycrystalline silicon is formed on the second insulating film 107 so as to completely fill the element isolation groove 106.

Figure 3:
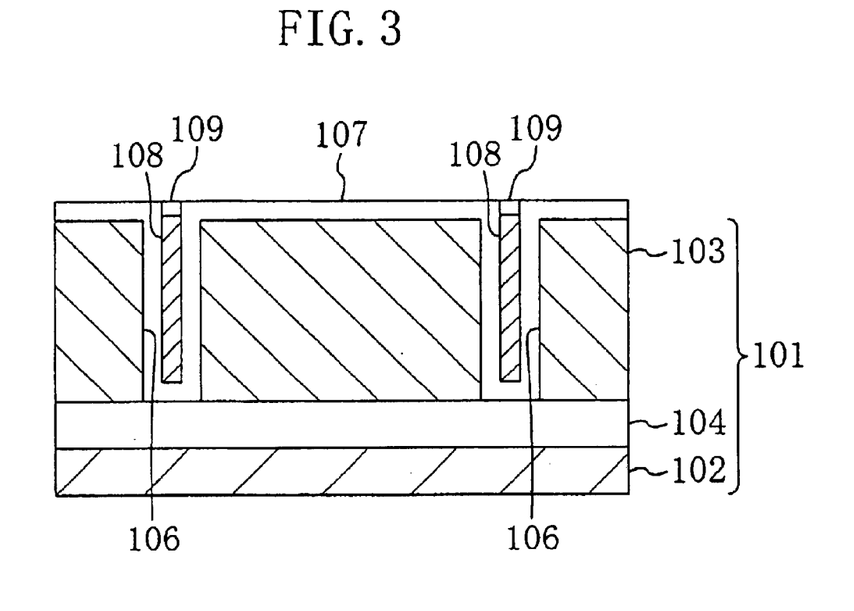
FIG. 3 is a cross-sectional view illustrating a step of the method for manufacturing a semiconductor device according to the first embodiment of the present invention.

Then, the embedded layer 108 is etched back by anisotropic dry etching such as RIE (Reactive Ion Etching). Thus, as shown in FIG. 3, the embedded layer 108 located outside the element isolation groove 106 is removed, so that the embedded layer 108 remains only within the element isolation groove 106. Subsequently, the upper portion of the remaining embedded layer 108 is thermally oxidized in the furnace step, forming a third insulating film 109 of silicon oxide at the surface of the embedded layer 108. Note that, in the step of etching back the embedded layer 108, the second insulating film 107 can be used as an etching stopper.

Figure 4:
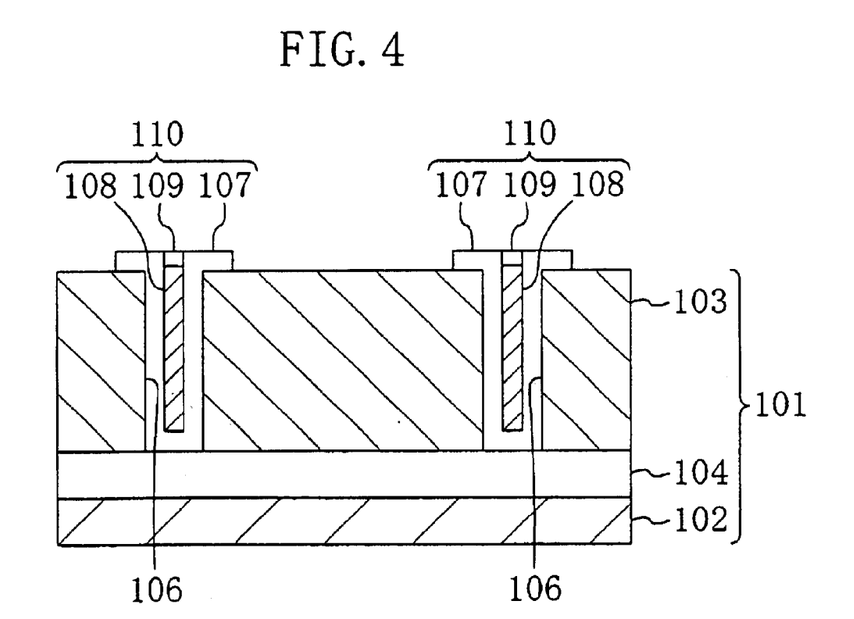
FIG. 4 is a cross-sectional view illustrating a step of the method for manufacturing a semiconductor device according to the first embodiment of the present invention.

Thereafter, photoresist is applied to the whole surface of the semiconductor substrate 101 so as to form a resist film (not shown). The resist film thus formed is patterned into a resist pattern (not shown) having an opening on an element formation region. The second insulating film 107 is then subjected to, e.g., wet etching using the resist pattern as an etching mask. Thus, the second insulating film 107 located on the element formation region is removed, as shown in FIG. 4. The resist pattern is then removed, thereby completing formation of a trench element isolation structure 110 including the second insulating film 107, the embedded layer 108 and the third insulating film 109.

Figure 5:
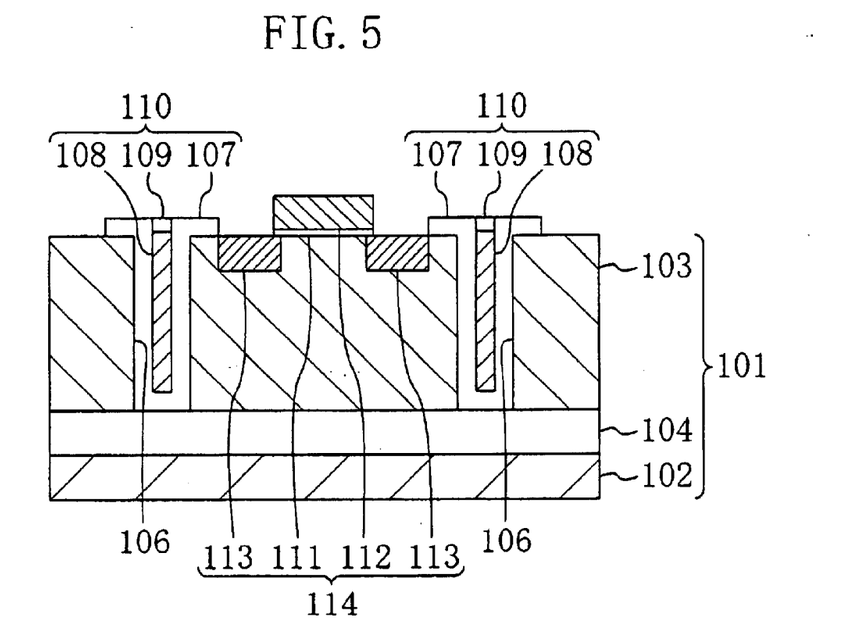
FIG. 5 is a cross-sectional view illustrating a step of the method for manufacturing a semiconductor device according to the first embodiment of the present invention.

Thereafter, a desired element is formed in the element formation region having the second insulating film 107 removed, that is, in the region of the substrate surface portion 103 surrounded by the trench element isolation structure 110. More specifically, in the first embodiment, a gate electrode 112 having a desired shape is formed on the substrate surface portion 103 of the semiconductor substrate 101 with a gate oxide film 111 interposed therebetween, as shown in FIG. 5. Thereafter, ions are implanted into the substrate surface portion 103 by using the second and third insulating films 107, 109 of the trench element isolation structure 110 and the gate electrode 112 as a mask. Thus, a pair of impurity diffusion layers 113 having a desired conductivity type are formed as source and drain regions on both sides of the gate electrode 112 in the substrate surface portion 103. As a result, a MOS transistor 114 is formed from the gate electrode 112, the impurity diffusion layers 113 and the like.

As has been described above, according to the first embodiment, the element isolation groove 106 extending to the first insulating film 104 is formed in the substrate surface portion 103 (i.e., single crystal silicon layer) on the first insulating film 104. The second insulating film 107 is then deposited in the element isolation groove 106 by using a vapor deposition method. Therefore, the trench element isolation structure 110 can be formed in the semiconductor substrate 101, i.e., the SOI substrate, without forming a thermal oxide film at the wall surface of the element isolation groove 106. In other words, the thermal oxidation step is no longer required which causes an oxide film to be grown along the interface of the first insulating film 104 and the substrate surface portion 103. As a result, crystal defects can be completely prevented from being generated in the single crystal silicon layer of the element formation region due to the stresses applied to, e.g., the lower corner of the element isolation groove 106. Accordingly, reliability of the element is significantly improved, resulting in significantly improved yield of the semiconductor device.

Moreover, according to the first embodiment, the second insulating film 107 is deposited so as to partially fill the element isolation groove 106, and the embedded layer 108 is formed on the second insulating film 107 so as to completely fill the element isolation groove 106. The embedded layer 108 is formed from the same material (silicon) as that of the substrate surface portion 103. Therefore, stress generation due to the factors such as the difference of the thermal expansion coefficient between the embedded layer 108 and the substrate surface portion 103 can be suppressed, thereby enabling improvement in reliability of the element. Furthermore, the third insulating film 109 is formed at the surface of the embedded layer 108. Therefore, degradation in reliability of the element does not occur even when the embedded layer 108 is electrically conductive.

Note that, in the first embodiment, the element isolation groove 106 is formed using the resist pattern 105 as an etching mask. However, the element isolation groove 106 may alternatively be formed using, e.g., a silicon oxide film, a silicon nitride film (see the second embodiment described below), or a laminated film of silicon oxide film and silicon nitride film as an etching mask.

Moreover, in the first embodiment, it is preferable to conduct the furnace step of annealing the second insulting film 107 (the annealing may be conducted either in the nitrogen atmosphere or oxygen atmosphere) after the second insulating film 107 is formed within the element isolation groove 106. This can make the second insulating film 107 dense, thereby improving the electric insulation property of the second insulating film 107.

Moreover, in the first embodiment, it is preferable to use a chemical vapor deposition method as a method for depositing the second insulating film 107. This enables a uniform coating structure of the second insulating film 107 to be provided inside the element isolation groove 106.

Moreover, in the first embodiment, the embedded layer 108 is etched back so as to remain only within the element isolation groove 106. Thereafter, the furnace step of thermally oxidizing the upper portion of the remaining embedded layer 108 is conducted. The second insulating film 107 located on the element formation region is then removed using the resist pattern as an etching mask. However, the first embodiment may alternatively be implemented as follows: the embedded layer 108 is etched back so as to remain only within the element isolation groove 106. The second insulating film 107 located on the element formation region is then removed using the resist pattern as an etching mask. Thereafter, the resist pattern is removed, and the furnace step of thermally oxidizing the upper portion of the remaining embedded layer 108 is then conducted.

Although polycrystalline silicon is used as a material of the embedded layer 108 in the first embodiment, another material such as amorphous silicon may alternatively be used. It should be noted that the embedded layer 108 is preferably formed from the same material as that of the substrate surface portion 103. This eliminates the difference of a physical constant such as thermal expansion coefficient between the embedded layer 108 and the substrate surface portion 103. Therefore, in various thermal processing steps in the semiconductor manufacturing process as well, stress generation can be suppressed as compared to the case where the element isolation groove 106 is filled only with an insulating film, thereby enabling improvement in reliability of the element. Furthermore, end-point detection in the step of etching back the embedded layer 108 is also facilitated.

Moreover, in the first embodiment, the MOS transistor 114 is formed in the element formation region. However, it should be understood that the present invention is not limited to this and another element such as bipolar element or resistive element may alternatively be formed therein.

Second Embodiment

Hereinafter, a method for manufacturing a semiconductor device according to the second embodiment of the present invention will be described with reference the figures.

FIGS. 6 to 13 are cross-sectional views illustrating the steps of the method for manufacturing a semiconductor device according to the second embodiment.

Figure 6:
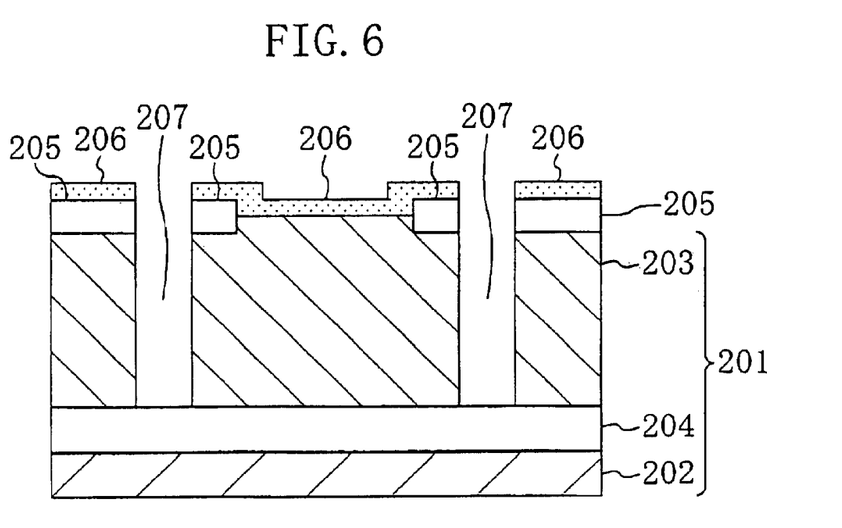
FIG. 6 is a cross-sectional view illustrating a step of a method for manufacturing a semiconductor device according to a second embodiment of the present invention.

First, as shown in FIG. 6, a semiconductor substrate 201 having an SOI structure is prepared. In the semiconductor substrate 201, a substrate base portion 202 and a substrate surface portion 203 are laminated each other with a first insulating film 204 of silicon oxide interposed therebetween. The substrate base portion 202 and the substrate surface portion 203 are both formed from single crystal semiconductor silicon.

Note that, in the second embodiment, a silicon oxide film 205 is formed in the region other than an element formation region in the substrate surface portion 203 by a LOCOS (Local Oxidation of Silicon) method. In other words, in the second embodiment, the LOCOS element isolation method and the trench element isolation method are combined, so that an appropriate element isolation method can be used according to the type of the element to be formed. For example, when a BiCMOS (Bipolar-CMOS (Complementary Metal Oxide Semiconductor)) integrated circuit is to be formed, the trench element isolation method is used for isolation of the bipolar element, whereas the LOCOS element isolation method is used for isolation of the MOS transistor.

Subsequently, as shown in FIG. 6, a silicon nitride film 206 is formed on the whole surface of the semiconductor substrate 201 by using a vapor deposition method. Photoresist is then applied to the whole surface of the semiconductor substrate 201 so as to form a resist film (not shown). By using a photolithography technique, the resist film thus formed is patterned into a resist pattern (not shown) having an opening on a prescribed region that will result in an element isolation region in a later step. The silicon nitride film 206 and the silicon oxide film 205 are then sequentially dry-etched for patterning using the resist pattern as an etching mask. The resist pattern is then removed. Thereafter, the substrate surface portion 203 is dry-etched using the patterned silicon nitride film 206 as an etching mask, whereby an element isolation groove 207 extending to the first insulating film 204 of the semiconductor substrate 201 is formed through the substrate surface portion 203. Note that, in the step of dry-etching the substrate surface portion 203, the first insulating film 204 can be used as an etching stopper.

Figure 7:
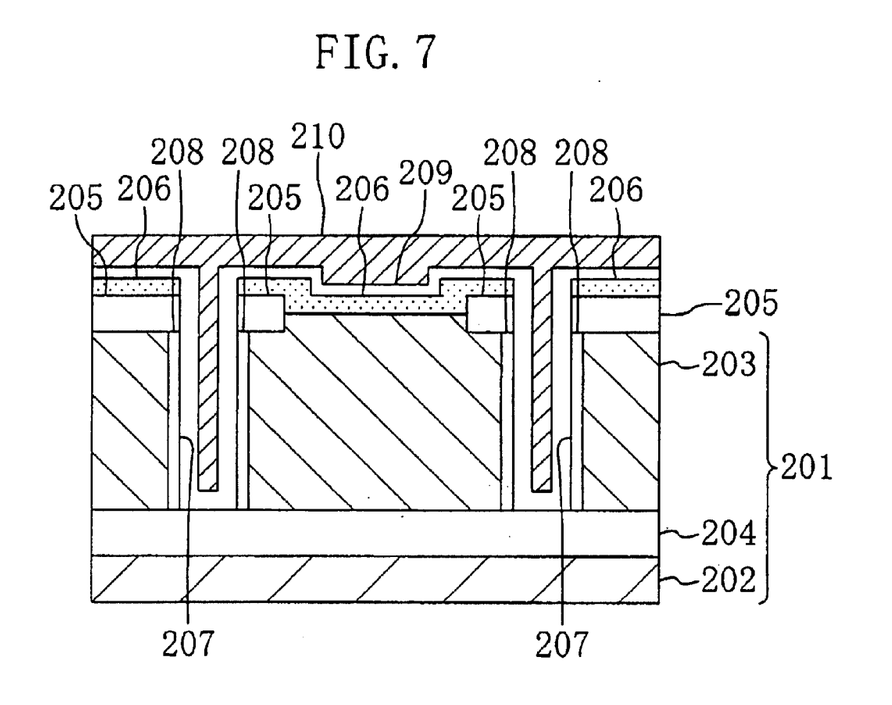
FIG. 7 is a cross-sectional view illustrating a step of the method for manufacturing a semiconductor device according to the second embodiment of the present invention.

As shown in FIG. 7, by using the furnace step, the substrate surface portion 203 is then thermally oxidized at the wall surface of the element isolation groove 207, thereby forming an oxide film 208, i.e., a silicon oxide film. The oxide film 208 functions as an electrically insulating film. In the second embodiment, this furnace step is conducted so that the oxide film 208 has a thickness of about 2 nm to about 50 nm. By using a vapor deposition method, a second insulating film 209 of silicon oxide is then deposited on the whole surface of the semiconductor substrate 201 including the inside of the element isolation groove 207 so as to cover the oxide film 208 and partially fill the element isolation groove 207. Thereafter, an embedded layer 210 of polycrystalline silicon is formed on the second insulating film 209 so as to completely fill the element isolation groove 207.

Figure 8:
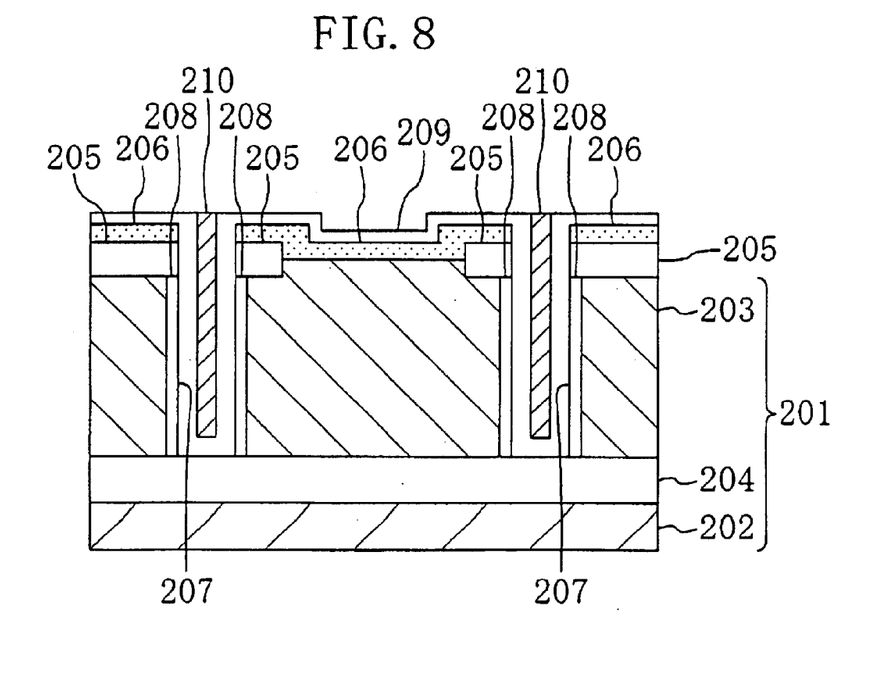
FIG. 8 is a cross-sectional view illustrating a step of the method for manufacturing a semiconductor device according to the second embodiment of the present invention.

As shown in FIG. 8, the embedded layer 210 is then etched back by anisotropic dry etching such as RIE. Thus, the embedded layer 210 located outside the element isolation groove 207 is removed, so that the embedded layer 210 remains only within the element isolation groove 207. Note that, in the step of etching back the embedded layer 210, the second insulating film 209 can be used as an etching stopper.

Figure 9:
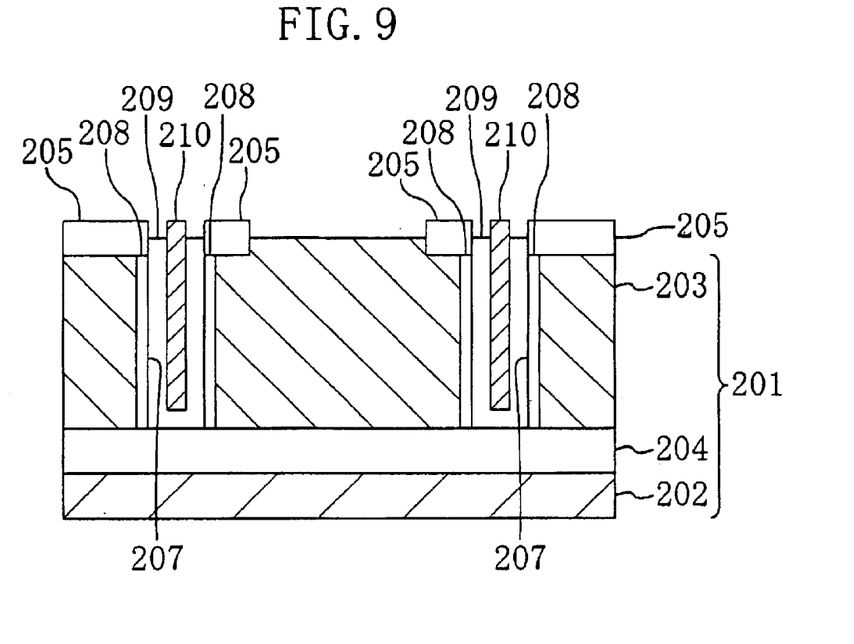
FIG. 9 is a cross-sectional view illustrating a step of the method for manufacturing a semiconductor device according to the second embodiment of the present invention.

Thereafter, as shown in FIG. 9, the second insulating film 209 contacting with the silicon nitride film 206 is removed by, e.g., wet etching. Subsequently, the silicon nitride film 206 is removed by, e.g., wet etching.

Figure 10:
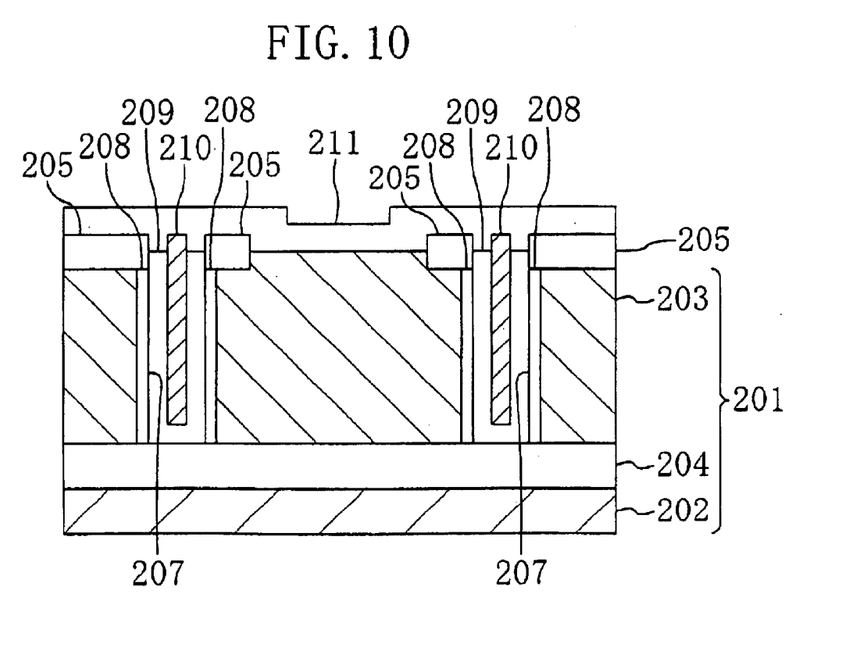
FIG. 10 is a cross-sectional view illustrating a step of the method for manufacturing a semiconductor device according to the second embodiment of the present invention.
Figure 11:
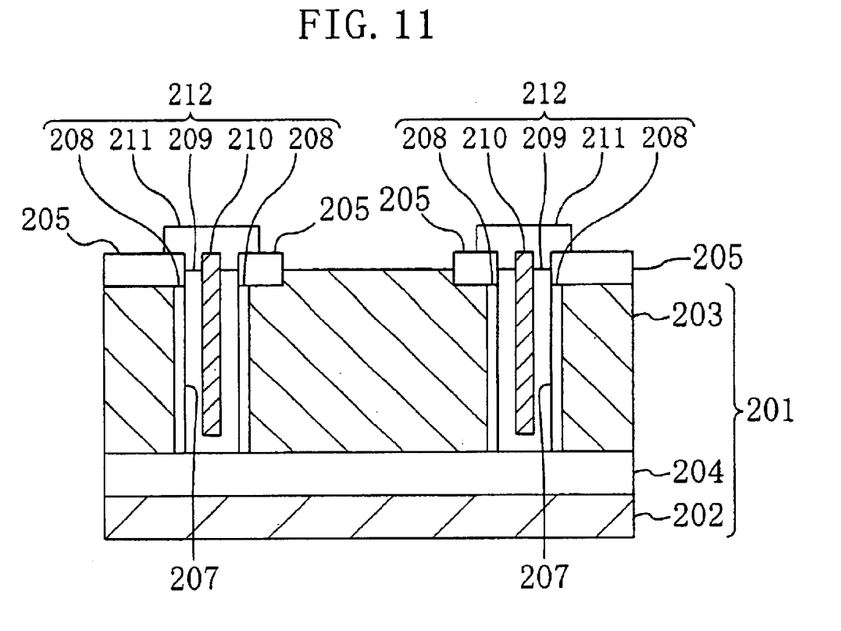
FIG. 11 is a cross-sectional view illustrating a step of the method for manufacturing a semiconductor device according to the second embodiment of the present invention.

As shown in FIG. 10, a third insulating film 211 is then deposited on the whole surface of the semiconductor substrate 201 by using a vapor deposition method. Photoresist is then applied to the whole surface of the third insulating film 211 so as to form a resist film (not shown). The resist film thus formed is patterned into a resist pattern (not shown) having an opening on the element formation region. The third insulating film 211 is then subjected to, e.g., wet etching using the resist pattern as an etching mask. Thus, the third insulating film 211 located on the element formation region is removed, as shown in FIG. 11. The resist pattern is then removed, thereby completing formation of a trench element isolation structure 212 including the oxide film 208, the second insulating film 209, the embedded layer 210 and the third insulating film 211.

Figure 12:
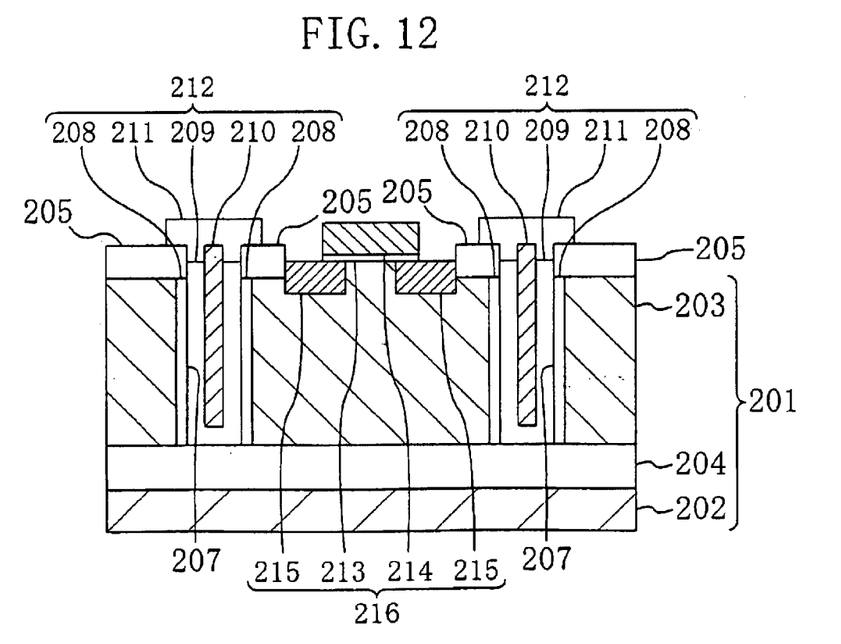
FIG. 12 is a cross-sectional view illustrating a step of the method for manufacturing a semiconductor device according to the second embodiment of the present invention.

Thereafter, a desired element is formed in the element formation region having the third insulating film 211 removed, that is, in the region of the substrate surface portion 203 surrounded by the trench element isolation structure 212. More specifically, in the second embodiment, a gate electrode 214 having a desired shape is formed on the substrate surface portion 203 of the semiconductor substrate 201 with a gate oxide film 213 interposed therebetween, as shown in FIG. 12. Thereafter, ions are implanted into the substrate surface portion 203 by using the silicon oxide film 205, the third insulating film 211 of the trench element isolation structure 212 and the gate electrode 214 as a mask. Thus, a pair of impurity diffusion layers 215 having a desired conductivity type are formed as source and drain regions on both sides of the gate electrode 214 in the substrate surface portion 203. As a result, a MOS transistor 216 is formed from the gate electrode 214, the impurity diffusion layers 215 and the like.

As has been described above, according to the second embodiment, the trench element isolation structure 212 can be implemented by the laminated structure of the oxide film 208 formed at the wall surface of the element isolation groove 207 by thermal oxidation and the second insulating film 209 formed on the oxide film 208 by a vapor deposition method. This enables significant reduction in thickness of the oxide film 208 formed at the wall surface of the element isolation groove 207. As a result, in the thermal oxidation step of forming the oxide film 208, the thickness of the oxide film 208 can be set so as to prevent crystal defects from being generated in the substrate surface portion 203 (i.e., single crystal silicon layer) of the element formation region due to the stresses intensively applied to, e.g., the lower corner of the element isolation groove 207. Accordingly, reliability of the element is significantly improved, resulting in significantly improved yield of the semiconductor device.

Moreover, according to the second embodiment, the second insulating film 209 is deposited so as to partially fill the element isolation groove 207, and the embedded layer 210 is formed on the second insulating film 209 so as to completely fill the element isolation groove 207. The embedded layer 210 is formed from the same material (silicon) as that of the substrate surface portion 203. Therefore, stress generation due to the factors such as the difference of the thermal expansion coefficient between the embedded layer 210 and the substrate surface portion 203 can be suppressed, thereby enabling improvement in reliability of the element. Furthermore, the third insulating film 211 is formed on the embedded layer 210. Therefore, degradation in reliability of the element does not occur even when the embedded layer 210 is electrically conductive.

Note that, in the second embodiment, the oxide film 208 preferably has a thickness of 50 nm or less. This ensures that crystal defects are prevented from being generated in the thermal oxidation step of forming the oxide film 208.

Moreover, in the second embodiment, the element isolation groove 207 is formed using the silicon nitride film 206 as an etching mask. However, the element isolation groove 207 may alternatively be formed using, e.g., a silicon oxide film or a laminated film of silicon oxide film and silicon nitride film as an etching mask. Alternatively, like the first embodiment, the element isolation groove 207 may be formed using a resist pattern as an etching mask.

Moreover, in the second embodiment, it is preferable to conduct the furnace step of annealing the second insulting film 209 (the annealing may be conducted either in the nitrogen atmosphere or oxygen atmosphere) after the second insulating film 209 is formed within the element isolation groove 207. This can make the second insulating film 209 dense, thereby improving the electric insulation property of the second insulating film 209.

Moreover, in the second embodiment, it is preferable to use a chemical vapor deposition method as a method for depositing the second insulating film 209. This enables a uniform coating structure of the second insulating film 209 to be provided inside the element isolation groove 207.

Moreover, in the second embodiment, the second insulating film 209 is formed on the semiconductor substrate 201 including the inside of the element isolation groove 207, and the embedded layer 210 is then formed on the second insulating film 209 so as to completely fill the element isolation groove 207. The embedded layer 210 is then etched back so as to remain only within the element isolation groove 207. Thereafter, the second insulating film 209 contacting with the silicon nitride film 206, and the silicon nitride film 206 are sequentially removed. However, the second embodiment may alternatively be implemented as follows: the silicon nitride film 206 is removed after formation of the element isolation groove 207. Thereafter, the second insulating film 209 is formed on the semiconductor substrate 201 including the inside of the element isolation groove 207, and the embedded layer 210 is then formed on the second insulating film 209 so as to completely fill the element isolation groove 207. The embedded layer 210 is then etched back so as to remain only within the element isolation groove 207. Thereafter, the second insulating film 209 located outside the element isolation groove 207 is removed. The second insulating film 209 located outside the element isolation groove 207 may be removed by wet etching or dry etching immediately after the embedded layer 210 is etched back. Alternatively, after the embedded layer 210 is etched back, the third insulating film 211 may be formed on the semiconductor substrate 201 so that the second insulating film 209 located on the element formation region is removed simultaneously with the third insulating film 211 located on the element formation region.

Figure 13:
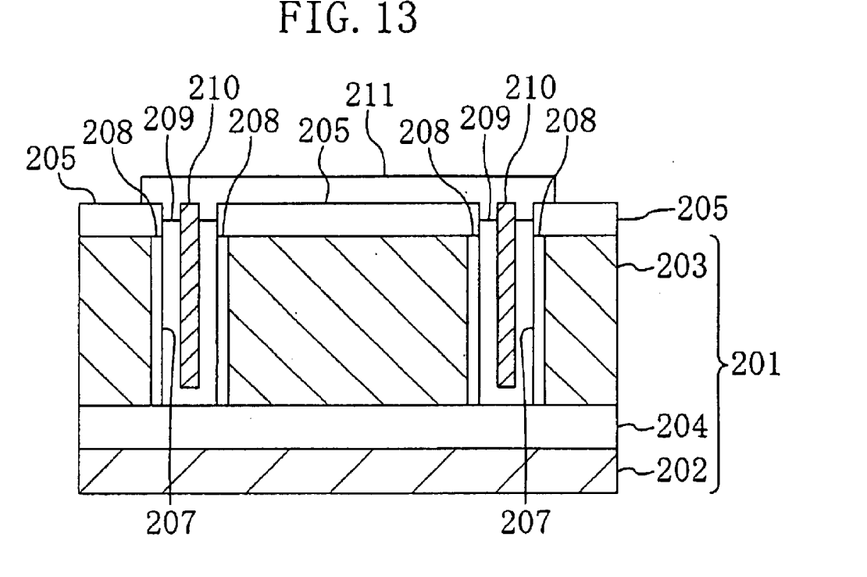
FIG. 13 is a cross-sectional view illustrating a step of the method for manufacturing a semiconductor device according to the second embodiment of the present invention.

Moreover, in the second embodiment, there may be the case where a pair of element isolation grooves 207 are located adjacent to each other in the region other than the element formation region (i.e., in the region of the substrate surface portion 203 covered with the silicon oxide film 205), as shown in FIG. 13. In such a case, in the step of removing the third insulating film 211 located on the element formation region, the third insulating film 211 may be patterned so as to continuously cover the pair of element isolation grooves 207.

Although polycrystalline silicon is used as a material of the embedded layer 210 in the second embodiment, another material such as amorphous silicon may alternatively be used. It should be noted that the embedded layer 210 is preferably formed from the same material as that of the substrate surface portion 203. This eliminates the difference of a physical constant such as thermal expansion coefficient between the embedded layer 210 and the substrate surface portion 203. Therefore, in various thermal processing steps in the semiconductor manufacturing process as well, stress generation can be suppressed as compared to the case where the element isolation groove 207 is filled only with an insulating film, thereby enabling improvement in reliability of the element. Furthermore, end-point detection in the step of etching back the embedded layer 210 is also facilitated.

Moreover, in the second embodiment, the MOS transistor 216 is formed in the element formation region. However, it should be understood that the present invention is not limited to this and another element such as bipolar element or resistive element may alternatively be formed therein.

What is claimed is:

1. A method for manufacturing a semiconductor device, comprising the steps of:

forming, in a semiconductor layer formed on a first insulating film, an element isolation groove extending to the first insulating film;

depositing a second insulating film so as to partially fill the element isolation groove by using a vapor deposition method;

forming an embedded layer on the second insulating film so as to completely fill the element isolation groove; and forming a third insulating film on the embedded layer, wherein the step of forming the element isolation groove includes another step of forming at least a pair of element isolation grooves with respect to one element formation region of the semiconductor layer;

in the step of forming the third insulating film, the third insulating film is formed such that the pair of element isolation grooves are continuously covered, second insulating film and the third insulating film are composed of SiO2 the pair of element isolation grooves sandwich a region other than the element formation region, and the third insulation region continuously covers the pair of element isolation grooves and the region other than the element formation region in the completed device.

2. The method according to claim 1, further comprising, between the step of forming the element isolation groove and the step of depositing the second insulating film, the step of forming an oxide film by oxidizing the semiconductor layer at a wall surface of the element isolation groove, wherein the step of depositing the second insulating film includes the step of depositing the second insulating film so as to cover the oxide film.

3. The method according to claim 2, wherein the oxide film has a thickness of 50 nm or less.

* * * * *